United States Patent [19]
Patel et al.

[11] Patent Number: 5,958,793
[45] Date of Patent: Sep. 28, 1999

[54] PATTERNING SILICON CARBIDE FILMS

[75] Inventors: Vipulkumar K. Patel, South Brunswick; Lawrence K. White, Princeton Jct.; Lawrence A. Goodman, Plainsboro, all of N.J.

[73] Assignee: Sarnoff Corporation, Princeton, N.J.

[21] Appl. No.: 08/998,353

[22] Filed: Dec. 24, 1997

[51] Int. Cl.⁶ .................... H01L 21/3065; H01L 21/314; H01L 21/316; H01L 21/318

[52] U.S. Cl. .................. 438/689; 438/742; 438/743; 438/706

[58] Field of Search .................... 438/689, 742, 438/743, 706

[56] References Cited

U.S. PATENT DOCUMENTS

| | | | |
|---|---|---|---|
| 4,351,894 | 9/1982 | Yonezawa et al. | 430/313 |
| 4,735,920 | 4/1988 | Stephani et al. | 437/234 |
| 4,865,685 | 9/1989 | Palmour | 156/643 |
| 4,981,551 | 1/1991 | Palmour | 156/643 |
| 5,571,374 | 11/1996 | Theor et al. | 156/643.1 |

*Primary Examiner*—Robert Kunemund
*Assistant Examiner*—Lynette T. Umez-Eronini
*Attorney, Agent, or Firm*—William J. Burke

[57] ABSTRACT

A method of etching an opening having tapered wall in a layer of silicon carbide (SiC) includes forming a layer of a resist on the SiC layer. An opening having tapered wall is formed in the resist layer so as to expose a portion of the SiC layer. The exposed portion of the SiC layer is then exposed to a plasma of a gas containing carbon and fluorine to etch an opening through the SiC layer with the opening having tapered walls. If a layer of a glass is provided under the SiC layer, the plasma will also etch through the glass layer to provide an opening in the glass layer having tapered walls.

4 Claims, 1 Drawing Sheet

PATTERNING SILICON CARBIDE FILMS

FIELD OF THE INVENTION

The present invention relates to a method of patterning silicon carbide (SiC) films, and, more particularly, to a method of etching tapered holes in a film of SiC.

BACKGROUND OF THE INVENTION

In certain types of semiconductor devices, films of SiC are used for various purposes. Often the SiC film is applied over a layer of a glass. In such devices it is often desirable to pattern the SiC film and the glass layer beneath the SiC film by etching it. One reason for patterning the SiC film is to form holes in the film through which conductors of a metal film can extend. To provide for greater ease of forming the conductors in the etched holes in the SiC film, it is desirable to form the holes with tapered walls. Various techniques and materials have been developed for etching tapered holes in various materials used in the semiconductor field. However, heretofore there have been no readily and successful method of etching tapered holes in a film of SiC, and particularly, also through a glass layer beneath the SiC film.

SUMMARY OF THE INVENTION

An opening is etched in a layer of silicon carbide (SiC) by first forming on the SiC layer a layer of a resist having an opening therethrough to expose a portion of the SiC layer. The exposed portion of the SiC layer is then exposed to a plasma of a gas containing carbon and fluorine so as to etch away the exposed portion of the SiC layer.

DETAILED DESCRIPTION

Figure 1:
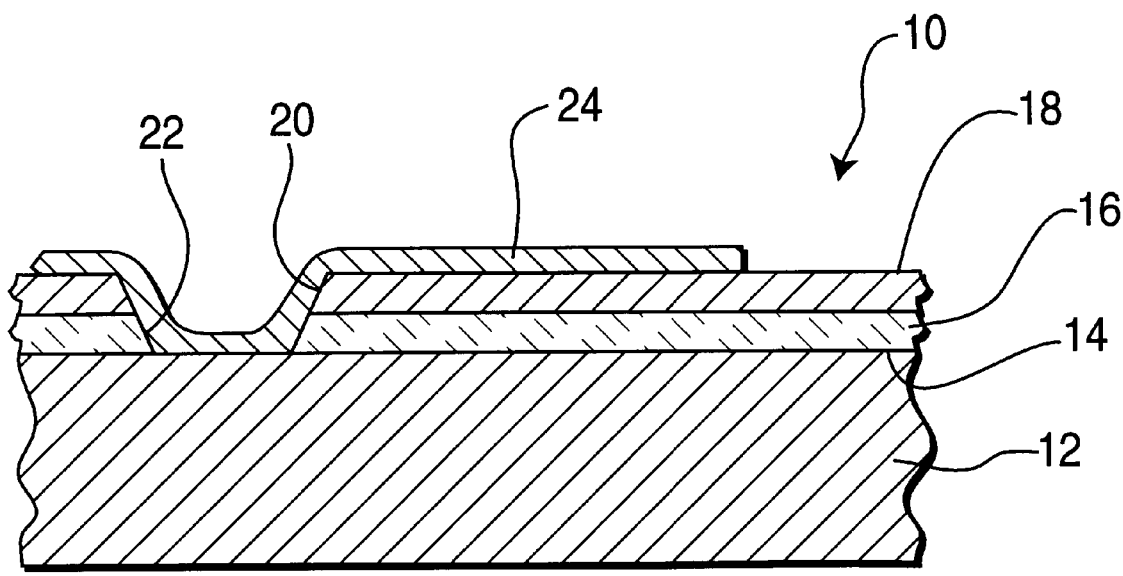
FIG. 1 is a sectional view of a portion of a semiconductor device made in accordance with the method of the present invention.

Referring initially to FIG. 1, there is shown a portion of a semiconductor device 10 which can be made by the method of the present invention. The semiconductor device 10 comprises a substrate 12 of a semiconductor material, such as single crystalline silicon. In the substrate 12 and at the surface 14 thereof there can be a plurality of regions, not shown, of different conductivity types which form various active and passive devices. A layer 16 of a glass is on the substrate surface 14, and a layer 18 of silicon carbide (SiC) is over the glass layer 16. The SiC layer 18 and the glass layer 16 have aligned holes 20 and 22 therethrough to the substrate surface 14. The walls of the holes 20 and 22 are tapered. A strip 24 of a conductive metal is on the SiC layer 18 and extends into and through the holes 20 and 22 to contact the substrate surface 14.

Figure 2:
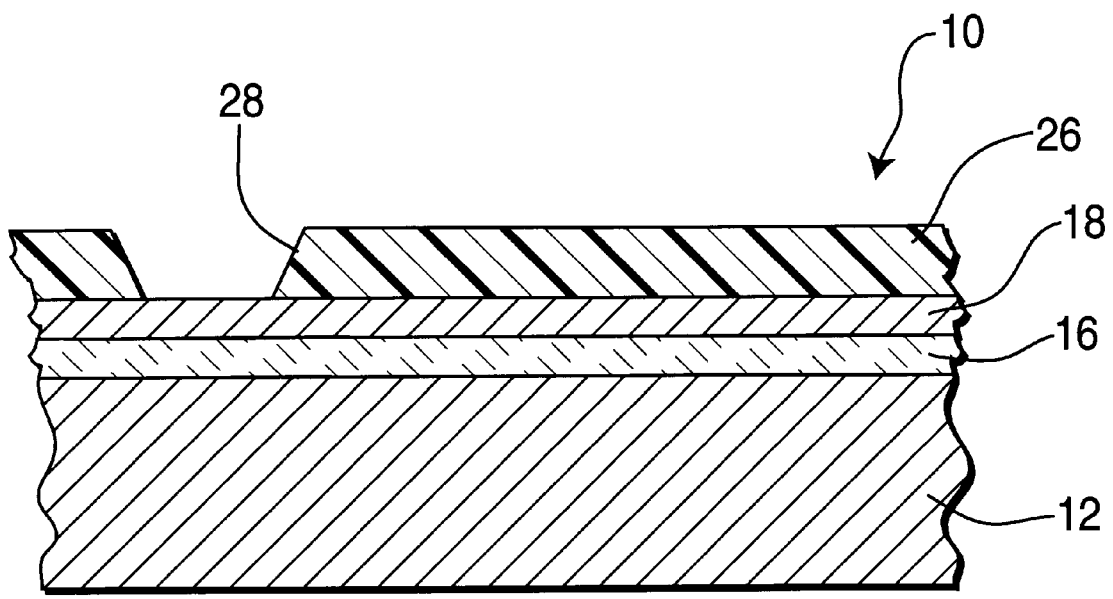
FIG. 2 is a sectional view showing the first step of the method of the present invention.

To make the semiconductor device 10, the glass layer 16 is first coated over the substrate surface 14 by any well known technique for the glass used. The SiC layer 18 is then coated over the glass layer 16 using any well known technique for depositing SiC. As shown in FIG. 2, a layer 26 of a resist material is then coated over the SiC layer 18. Preferably, the resist layer 26 is of a thickness 2 or more times the thickness of the SiC layer 18. An opening 28 is then formed in the resist layer 26. The opening 28 must have tapered walls in order to form tapered wall openings in the SiC layer 18 and the glass layer 16. There are several well known techniques for producing tapered resist wall profiles. Most low resolution printing techniques, such as proximity gap or scanning projection printers, produce sloped wall profiles of less than 70° with respect to the horizontal. Some resist systems require special resist processing procedure to produce tapered wall profiles, such as flood exposure (see the article by L. K. White and D. Meyerhofer, JOURNAL OF ELECTRO-CHEMICAL SOCIETY, Vol. 134(12), 1987, pg. 3125).

The opening 28 exposes a portion of the surface of the SiC layer 18. In an embodiment, the exposed surface of the SiC layer 18 is then exposed to a non-oxygen containing plasma of a gas containing carbon (C) and fluorine (F). It has been found that oxygen containing plasmas erode the resist much faster than the SiC etches. Also, the oxygen tends to etch the polymer depositions in the system over time producing wide etch rate variations and unacceptable etch residue remaining behind after etching. The most successful etching of SiC films has been done in plasmas of pure $CF_4$, $C_2F_6$ or these gases mixed with small additions of $CHF_3$. Positive results also have been obtained using $NF_3$ and $SF_6$ as etch gases and these gases mixed with $O_2$, which have proven to be less deleterious to the resist than $CF_4$ or $C_2F_6$ mixed with oxygen. This plasma etches a hole 20 in the SiC layer 18 having a tapered wall. By controlling the power, pressure and gas flow of the plasma gas, it is not only possible to etch through the SiC layer 18, but also the opening 22 can be etched through the glass layer 16. For example, in a parallel plate plasma etcher a power of 50 W, a flow rate of $CF_4$ of 60 ssccm, and a pressure of 150 mTorr., will etch both the SiC layer 18 and the glass layer 16 and provide holes 20 and 22 having tapered walls.

Thus, there is provided by the present invention a method of etching SiC layers so as to pattern the layer with the opening in the SiC layer having a tapered wall. Also, the method will etch through a layer of glass beneath the SiC layer and provide an opening in the glass layer having a tapered wall.

What is claimed is:

1. A method of etching an opening in a layer of silicon carbide (SiC) comprising the steps of:

forming on a SiC layer a layer of a resist material having an opening therethrough so as to expose a portion of the SiC layer: and subjecting the exposed portion of the SiC layer to a plasma of a non-oxygen containing gas of $CF_4$ or $C_2F_6$ and a small amount of $CHF_3$ so as to etch away the exposed portion of the SiC layer.

2. The method of claim 1 wherein the opening in the resist layer has tapered walls so as to form an opening in the SiC layer having tapered walls.

3. A method of etching an opening through layers on a surface of a substrate comprising the steps of:

forming a layer of a glass on the surface of the substrate;

forming a layer of silicon carbide (SiC) on the glass layer;

forming a layer of a resist material on the SiC layer;

forming an opening through the resist material layer so as to expose a portion of the SiC layer; and subjecting the exposed portion of the SiC layer to a plasma of a non-oxygen containing gas of $CF_4$ or $C_2F_6$ and a small amount of $CHF_3$ so as to etch through the SiC layer and through the glass layer.

4. The method of claim 3 wherein the opening in the resist layer has tapered walls so as to etch openings in the SiC layer and the glass layer having tapered walls.

* * * * *